(12) United States Patent
Ito

(10) Patent No.: US 7,863,938 B2
(45) Date of Patent: Jan. 4, 2011

(54) ADDRESS DECODER AND METHOD FOR SETTING AN ADDRESS

(75) Inventor: Toshiaki Ito, Sendai (JP)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 12/704,497

(22) Filed: Feb. 11, 2010

(65) Prior Publication Data

US 2010/0231262 A1 Sep. 16, 2010

(30) Foreign Application Priority Data

Mar. 10, 2009 (JP) .............................. 2009-056868

(51) Int. Cl.
*H03K 19/082* (2006.01)
(52) U.S. Cl. ........................................ 326/105; 326/93
(58) Field of Classification Search .................. 326/46, 326/93, 105

See application file for complete search history.

(56) References Cited

U.S. PATENT DOCUMENTS 5,778,439 A * 7/1998 Trimberger et al. ......... 711/153
2008/0147941 A1 6/2008 Deshpande et al.

* cited by examiner

*Primary Examiner*—Don P Le
(74) *Attorney, Agent, or Firm*—Charles Bergers

(57) ABSTRACT

An address decoder that sets an address of a module connected to a bus includes a level comparator, an edge detector, and an output decoder. The level comparator compares an SDA signal, which is input to an SDA terminal, with an address selection signal, which is input to an ADDR terminal, and outputs a comparison result. When the two signals match, the comparison is repeated until slave addresses are all received. When the two signals do not match, subsequent comparisons are not performed. The edge detector detects an edge of the address selection signal input to the ADDR terminal. The output decoder sets an address corresponding to the connected destination of the ADDR terminal to determine an address of a slave module connected to the address decoder.

5 Claims, 6 Drawing Sheets

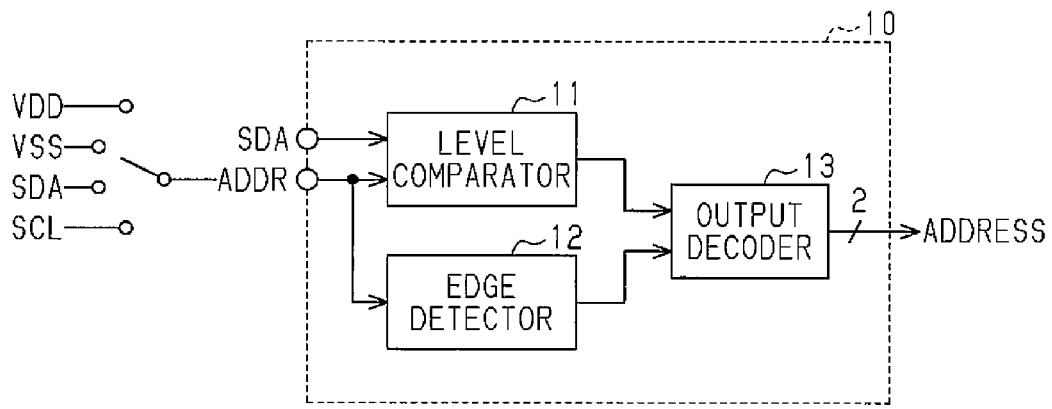

FIG.3A
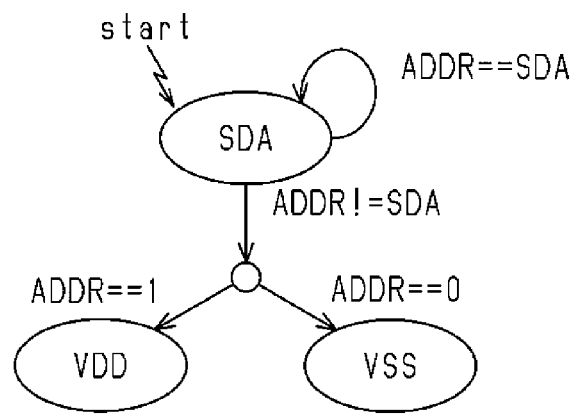
FIG.3B
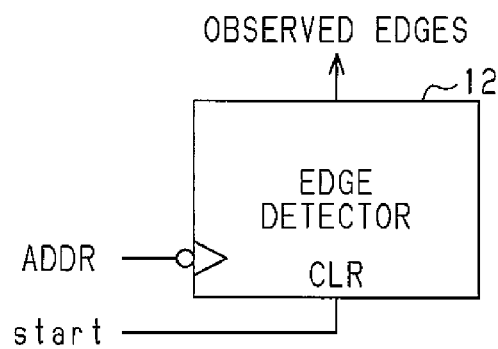
FIG.3C
OUTPUT DECODER ~T20
| OUTPUT | LEVEL | EDGE |
|--------|-------|------|
| SDA | SDA | X |
| SCL | NOT SDA | 1 |
| VDD | VDD | 0 |
| VSS | VSS | 0 |
HIGH PRIORITY ↓ LOW PRIORITY

FIG. 4A
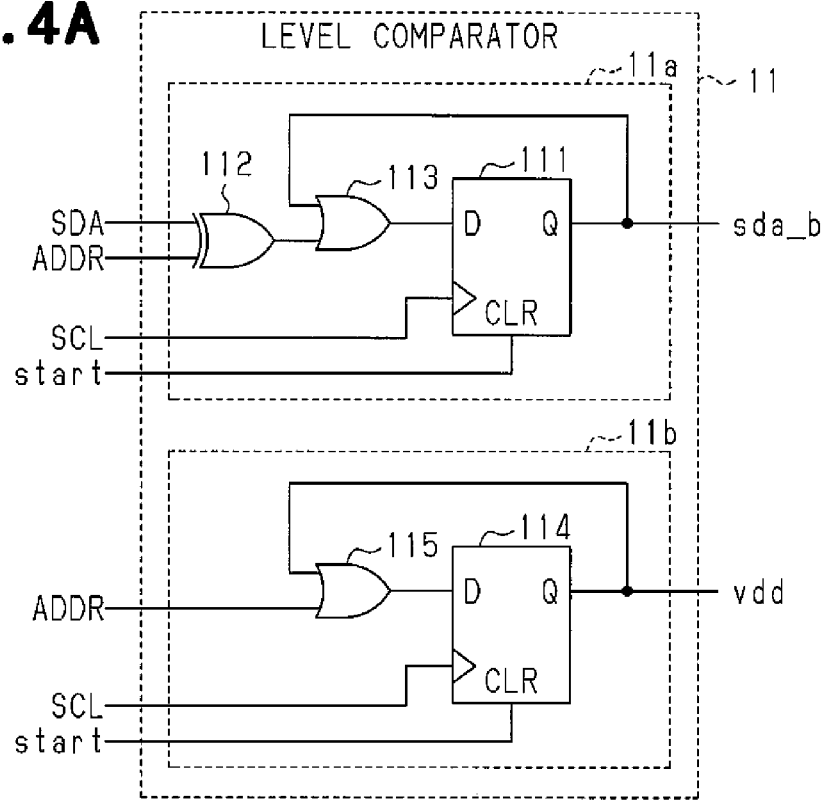
FIG. 4B
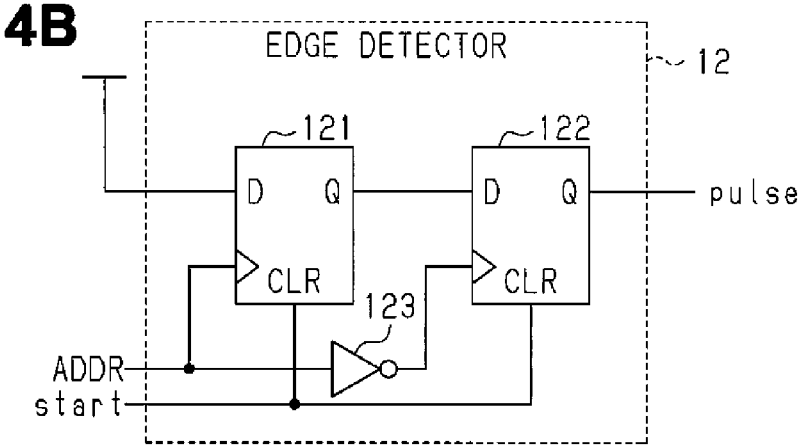
FIG. 4C
| OUTPUT | sda_b | pulse | vdd |
|---|---|---|---|
| SDA | 0 | X | X |
| SCL | 1 | 1 | X |
| VDD | 1 | 0 | 1 |
| VSS | 1 | 0 | 0 |
T30
HIGH PRIORITY ↓ LOW PRIORITY

FIG.5A
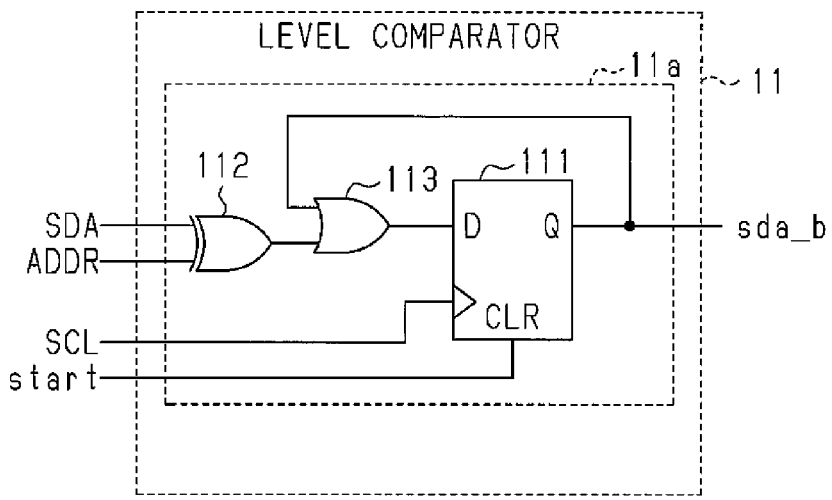
FIG.5B
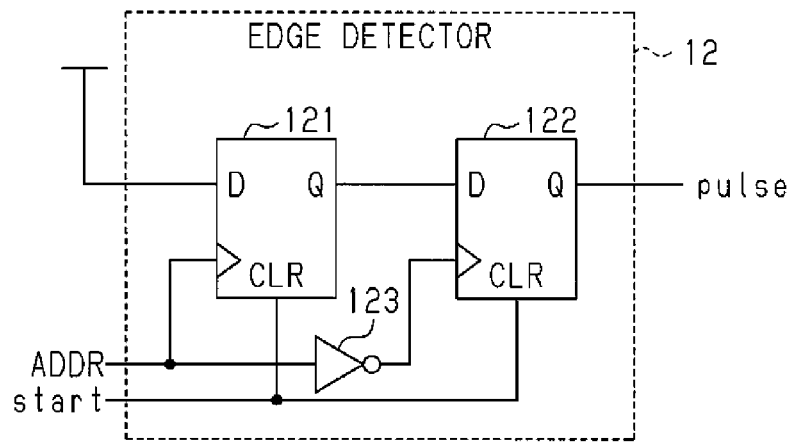
FIG.5C
| OUTPUT | sda_b | pulse | ADDR | T40 |
|---|---|---|---|---|
| SDA | 0 | X | X | HIGH PRIORITY |
| SCL | 1 | 1 | X | |
| VDD | 1 | 0 | 1 | |
| VSS | 1 | 0 | 0 | LOW PRIORITY |

FIG.7

| OUTPUT | sda | pulse | vdd | ~T50 |
|---|---|---|---|---|
| SDA | 1 | X | X | |
| SCL | 0 | 1 | X | |
| VDD | 0 | 0 | 1 | |
| VSS | 0 | 0 | 0 | |

HIGH PRIORITY ↓ LOW PRIORITY

US 7,863,938 B2

ADDRESS DECODER AND METHOD FOR SETTING AN ADDRESS

BACKGROUND OF THE INVENTION

The present invention relates to the control of modules connected to a bus line, and more particularly, to the setting of device addresses.

Modules arranged both inside and outside of a computer may be connected to a common line, which is used to exchange information (bus connection). In such a bus connection, an address is set for each module. Further, a control module (master) transmits a command, which includes the address of a controlled module (slave). Each slave compares the received controlled address with its own preset address. When the controlled address and preset address are the same, the slave responds to the command.

Communication systems may use an I2C (Inter-Integrated Circuit) serial transfer bus that uses two signal lines, one for a serial data (SDA) signal and the other for a serial clock (SCL) signal. These signals are in compliance with an I2C communication protocol.

The number of modules may be increased in, for example, a touch sensor, to increase the number of touch keys. This would allow a user to select a plurality of addresses and make the product more appealing.

When using sensors that function as I2C communication slaves, an address must be set for each slave. To allow the user to easily set the address, each module has an address input terminal (ADDR terminal), and an address is selected in accordance with the input level of the ADDR terminal. The easiest way to set the address would be to use the ADDR terminal as a digital input that detects a binary value. However, the number of ADDR terminals must be increased to connect more modules to the communication bus. Thus, in a sensor that has many packages that have few terminals, it would be difficult to provide many terminals just for use as address inputs.

Accordingly, techniques for setting the addresses of slave modules have been developed (e.g., refer to U.S. Patent Application Publication No. 2008/0147941, page 1 and FIG. 3). In the technique described in U.S. Patent Application Publication No. 2008/0147941, a communication system includes a slave device having address pins. The slave device is coupled to a serial data line, a clock line, a power line, and a ground line. A communication circuit communicates with a master device in accordance with a communication protocol over a data transfer bus. A decoding circuit detects a first state of the address pins. The decoding circuit than detects a second state of the address pins. If one or more logic values of the address pins differs between the first and second states then, the decoding circuit decodes a slave device address as a functional relationship between the first and second states of the address pins.

However, this technique is dependent on a certain communication protocol and thus is not very versatile. Further, the technique uses delay elements, and the operational characteristics are strongly affected by process variations that may occur during manufacturing. Thus, the technique is not well suited for integration. Further, the comparison and detection of each state must be performed at appropriate times.

BRIEF DESCRIPTION OF THE DRAWINGS

The invention, together with objects and advantages thereof, may best be understood by reference to the following description of the presently preferred embodiments together with the accompanying drawings in which:

FIG. 1 is a schematic block diagram of an address decoder according to one embodiment of the present invention;

FIGS. 2A to 2C are tables showing the outputs of the functional block of the address decoder of FIG. 1, where FIG. 2A shows the outputs of a level comparator, FIG. 2B shows the outputs of an edge detector, and FIG. 2C shows the outputs of an output decoder;

FIGS. 3A to 3C are diagrams showing the operation of the functional blocks of the address decoder of FIG. 1, where FIG. 3A shows the operation of the level comparator, FIG. 3B shows the operation of the edge detector, and FIG. 3C shows the operation of the output decoder;

FIGS. 4A to 4C are diagrams showing the logic circuit structure of the functional blocks of the address decoder of FIG. 1, where FIG. 4A shows the logic circuit structure of the level comparator, FIG. 4B shows the logic circuit structure of the edge detector, and FIG. 4C is a truth table for the output decoder;

FIGS. 5A to 5C are diagrams showing the circuit structure of the functional blocks of the address decoder of FIG. 1 in accordance with another embodiment of the present invention, where FIG. 5A shows the logic circuit structure of the level comparator, FIG. 5B shows the logic circuit structure of the edge detector, and FIG. 5C is a truth table of the output decoder;

FIGS. 6A and 6B are flowcharts showing processes performed by the functional blocks of the address decoder according to a further embodiment of the present invention, in which FIG. 6A shows the steps performed by a level comparator, and FIG. 6B shows the steps performed by an edge detector; and FIG. 7 is a table showing the outputs of an edge detector of an address decoder according to yet another embodiment of the present invention.

DETAILED DESCRIPTION OF THE INVENTION

Figure 6A:
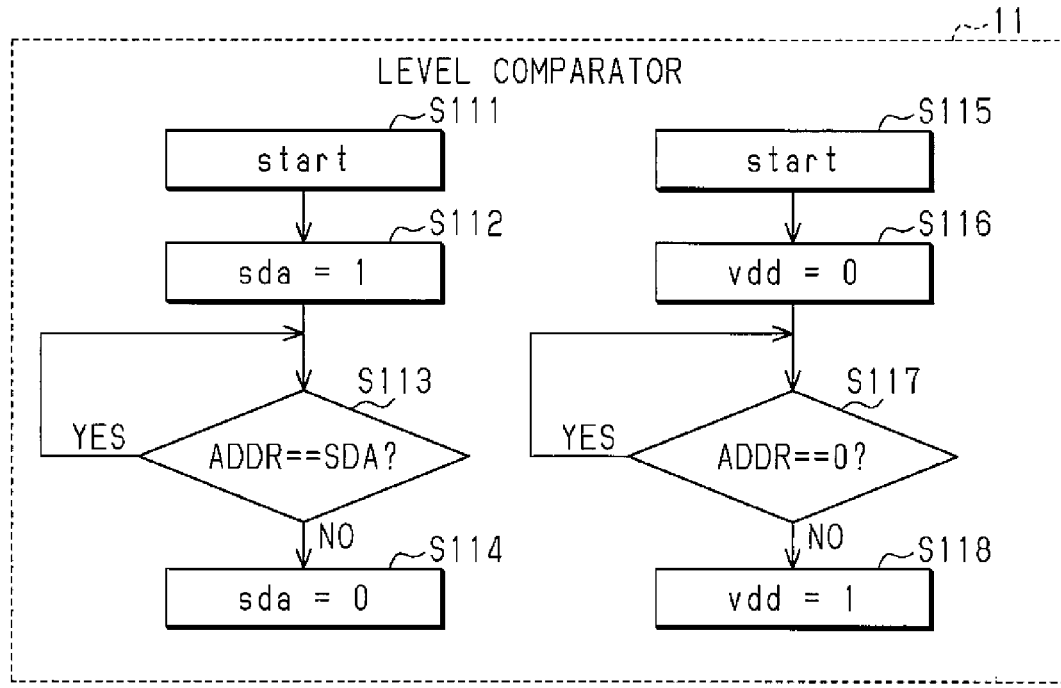

The present invention provides an address decoder and a method for setting an address that easily and efficiently set an address of a module connected to a bus.

One aspect of the present invention is an address decoder including a reference signal input terminal for a serial data signal and an address selection signal input terminal for an address selection signal formed by one of a power supply voltage, a ground voltage, and a serial data signal. A signal intensity comparator compares the serial data signal input to the reference signal input terminal, with the address selection signal input to the selection signal input terminal, and outputs a comparison result. An address setting unit specifies the signal input as the address selection signal based on the comparison result output by the signal intensity comparator, and a signal level of the address selection signal, to set an address corresponding to the specified signal.

A further aspect of the present invention is a method for setting an address using a reference signal input terminal for a serial data signal, an address selection signal input terminal for an address selection signal formed by one of a power supply voltage, a ground voltage, and a serial data signal, and a controller for outputting the address selection signal. The controller executes the steps of comparing the serial data signal input to the reference signal input terminal, with the address selection signal input to the selection signal input terminal, and outputting a comparison result; and specifying the signal input as the address selection signal based on the comparison result and a signal level of the address selection signal and setting an address corresponding to the specified signal.

Other aspects and advantages of the present invention will become apparent from the following description, taken in conjunction with the accompanying drawings, illustrating by way of example the principles of the invention.

An address decoder and an address setting method according to one embodiment of the present invention will now be discussed with reference to FIGS. 1 to 4. An address decoder that sets an address of a slave module in a master-slave structure will be described. In accordance with the I2C communication protocol, the transfer of starting conditions, addresses, acknowledgements, data, and stop conditions are performed between the master module and the slave module.

Referring to FIG. 1, an address decoder 10 includes an SDA terminal, which functions as a reference signal input terminal, and an ADDR terminal, which functions as a selection signal input terminal. The SDA terminal receives an SDA signal, and the ADDR terminal receives an address selection signal. The slave address must be set as a unique address for each module. Thus, the address signal always includes "0" or "1". The address decoder 10 uses this feature to detect connection of the ADDR terminal to one of a VDD line, which is supplied with power supply voltage, a VSS line, which is supplied with ground voltage, an SDA line, which is provided with a serial data signal (SDA signal), and an SCL line, which is supplied with a serial clock signal (SCL signal).

The address decoder 10 includes a level comparator 11, which serves as a signal intensity comparator, an edge detector 12, which functions as an edge detection unit, and an output decoder 13, which functions as an address setting unit.

The level comparator 11 compares the SDA signal, which is input to the SDA terminal, and the address selection signal, which is input to the ADDR terminal. When the two signals match, the level comparator 11 generates a "TRUE" output and continues comparison until receiving all of the slave addresses. When the two signals do not match, the level comparator 11 generates a "FALSE" output and does not perform subsequent comparisons.

The edge detector 12 detects whether the address selection signal input to the ADDR terminal has a rising edge, a falling edge, or a pulse to determine that the signal input to the ADDR terminal does not have a fixed level. When the signal does not have a fixed level, the ADDR terminal is connected to the SDA line or the SCL line.

The output decoder 13 sets an address corresponding to the connected destination of the ADDR terminal and thereby determines the address (seven bits for I2C communication) of the slave module that includes the address decoder 10. When the address transfer from a master module is completed, the slave module having a matching address sends a receipt acknowledgement signal (ACK) to the master module. This establishes communication between the master module and the slave module.

[Output of Functional Blocks of the Address Decoder]

Output signals of the level comparator 11, the edge detector 12, and the output decoder 13 will now be described with reference to FIGS. 2A to 2C.

The level comparator 11 uses table T11, which is shown in FIG. 2A, to check whether the SDA signal is matched and determine the signal level.

The level comparator 11 compares the address selection signal, which is input to the ADDR terminal, and the SDA signal, which is input to the SDA terminal. When the signals are the same, the level comparator 11 outputs "0".

When the signal input to the ADDR terminal differs from the SDA signal, the ADDR terminal is connected to the VDD line, the VSS line, or the SCL line. When a signal having a high level is input, the ADDR terminal is connected to the power supply line or the SCL line. Thus, the level comparator 11 outputs "1". When a signal having a low level is input, the ADDR terminal is connected to the ground line or the SCL line. Thus, the level comparator 11 outputs "2".

The edge detector 12 uses table T12, which is shown in FIG. 2B, to determine the presence of an edge. When the ADDR terminal is connected to the SDA line or the SCL line and an edge is connected, the edge detector 12 outputs "1". When the ADDR terminal is connected to the power supply line or the ground line and an edge is not connected, the edge detector 12 outputs "0".

The output decoder 13 uses table T13, which is shown in FIG. 2C, to determine the connected destination of the ADDR terminal and sets an address in correspondence with the determination.

More specifically, when the output of the level comparator 11 is "0", the output decoder 13 determines that the SDA line is connected. When the output of the level comparator 11 is "1" or "2" and the output of the edge detector 12 is "1", the output decoder 13 determines that the SCL line is connected. When the output of the level comparator 11 is "1" and the output of the edge detector 12 is "0", the output decoder 13 determines that the power supply line is connected. Otherwise, the output decoder 13 determines that the ground line is connected. Addresses are determined from "SDA" to "VSS" in an order of priority, with "SDA" having the highest priority.

[Operation of Address Decoder]

The shifting of conditions for determination of the connected destination of the ADDR terminal in the address decoder will now be discussed with reference to FIG. 3A.

In a start condition, the level comparator 11 compares the SDA signal input to the SDA terminal, with the address selection signal input to the ADDR terminal. When the two signals have matching levels, the level comparator outputs "SDA" as a signal "LEVEL" and repeats the comparison.

When the address selection signal input to the ADDR terminal differs from the SDA signal input to the SDA terminal, the level comparator 11 outputs "VDD" or "VSS" as the signal "LEVEL" in correspondence with the level of the address selection signal input to the ADDR terminal.

In the edge detector 12, referring to FIG. 3B, the edge detector 12 outputs a signal "EDGE" in accordance with a change in the level of the address selection signal input to the ADDR terminal. The edge detector 12 outputs "1" as the signal "EDGE" when a signal level change is detected and outputs "0" when a signal level change is not detected.

The output decoder 13 uses table T20, which is shown in FIG. 3C, to determine the connected line with the signal "LEVEL" output from the level comparator 11 and the signal "EDGE" output from the edge detector 12. When the signal "LEVEL" is "SDA", the output decoder 13 outputs "SDA". When the signal "LEVEL" is not "SDA" and the signal "EDGE" is "1", the output decoder 13 outputs "SCL". When the signal "EDGE" is "0" and the signal "LEVEL" is "VDD", the output decoder 13 outputs "VDD". When the signal "EDGE" is "0" and the signal "LEVEL" is "VSS", the output decoder 13 outputs "VSS".

[Example of Address Decoder]

An example of the structure of the level comparator 11 will now be discussed with reference to FIG. 4A. Here, the level comparator 11 includes a first circuit 11a and a second circuit 11b.

The first circuit 11a includes a D flip-flop 111, an XOR gate 112, and an OR gate 113. The signals input to the SDA terminal and the ADDR terminal of the level comparator 11 are received by the XOR gate 112. An output signal of the XOR gate 112 is input to the OR gate 113. The OR gate 113 also receives a signal "sda_b", which is output from the D flip-flop 111. An output of the OR gate 113 is input to a data input terminal of the D flip-flop 111. The D flip-flop further receives the SCL signal and a start signal (signal indicating a start condition). The D flip-flop 111 outputs the signal "sda_b".

When the signals input to the SDA terminal and the ADDR terminal match, the XOR gate 112 continuously outputs "0", and the signal "sda_b" of the D flip-flop 111 is continuously output as "0". When the signals input to the SDA terminal and the ADDR terminal do not match, once the XOR gate 112 outputs "1", the signal "sda_b" of the D flip-flop 111 is continuously output as "1".

The second circuit 11b includes a D flip-flop 114 and an OR gate 115. The address selection signal input to the ADDR terminal of the level comparator 11 is provided to the OR gate 115. The OR gate 115 is also provided with a signal "vdd", which is output from the D flip-flop 114. The output signal of the OR gate 115 is provided to the D flip-flop 114. The D flip-flop 114 also receives the SCL signal and the start signal. When the ADDR terminal is connected to the power supply line, the signal "vdd" is continuously output as "1". When the ADDR terminal is connected to the ground line, the signal "vdd" is continuously output as "0".

An example of the structure of the edge detector 12 will now be discussed with reference to FIG. 4B. The edge detector 12 includes two D flip-flops 121 and 122. The D flip-flops 121 and 122 each have a data terminal, which receives power supply voltage. The D flip-flop 121 includes a clock terminal that receives the address selection signal ADDR. The D flip-flop 122 includes a clock terminal that receives an inverted signal of the address selection signal ADDR from an inverter 123. In this case, when the rising and falling of the address selection signal input to the ADDR terminal is detected, a signal "pulse" is output as "1".

The output decoder 13 generates outputs in accordance with table T30, which is shown in FIG. 4C. Connected destinations "SDA", "SCL", "VDD", and "VSS" are determined from the signals "sda_b", "vdd", and "pulse". The output decoder 13 outputs an address in correspondence with the connected destination and sets the address of the slave module.

The above-described embodiment has the advantages described below.

In the embodiment described above, the address decoder 10 includes the SDA terminal and the ADDR terminal. The SDA terminal receives the SDA signal. The ADDR terminal receives the address selection signal, which is one of the power supply level, the ground level, the SDA signal, and the SCL signal. Further, the address decoder 10 uses the level comparator 11, the edge detector 12, and the output decoder 13 to determine the connected destination of the ADDR terminal and designate an address. An address may be set based on the input of four values, which are the power supply level, the ground level, the SDA signal, and the SCL signal. Accordingly, even when only a small number of terminals can be used to set an address, various types of addresses may be set with a simple circuit structure.

In the embodiment described above, the edge detector 12 detects the presence of an edge and outputs the signal "EDGE" (signal "pulse"). From these signals, the output decoder 13 identifies a static signal (power supply level or ground level) and a dynamic signal. This allows for the setting of an address with the SCL signal.

It should be apparent to those skilled in the art that the present invention may be embodied in many other specific forms without departing from the spirit or scope of the invention. Particularly, it should be understood that the present invention may be embodied in the following forms.

In the embodiment described above, the address decoder 10 includes the SDA terminal and the ADDR terminal. The address decoder 10 may have more than one ADDR terminal. In such a case, various addresses may be designated from combinations that are in accordance with the input of each ADDR terminal.

In the embodiment described above, the level comparator 11 uses the first circuit 11a, which includes the D flip-flop 114 and the OR gate 115, to continuously output "1" or "0" as the signal "vdd". Instead, the signal input to the ADDR terminal may be directly used to determine the power supply level or the ground level. More specifically, as shown in FIG. 5A, the level comparator 11 may include just the first circuit 11a, and the second circuit 11b may be eliminated. In such a case, the structure of the edge detector 12 is as shown in FIG. 5B. This structure is the same as the structure shown in FIG. 4B. Further, the output decoder 13 uses a table T40, which is shown in FIG. 5C, to determine the connected destination of the ADDR terminal. As a result, the level comparator 11 has a simple structure.

In the embodiment described above, the edge detector 12 detects the presence of an edge. In this case, the edge detector 12 detects the rising edge or falling edge of an ADDR input and determined whether the ADDR input is a pulse. Instead, the edge detector 12 may be formed to detect just one of the rising and falling edges. In such a case, the edge detector 12 may be formed from a single D flip-flop.

Further, the number of D flip-flops that are used may be the same as the number of pulses forming the address selection signal. In such a case, edges or pulses may be counted and compared with an expected value. This allows for the edge detector 12 to be used as a counter to detect the number of bits of the address selection signal and accurately determine the receipt of the address selection signal.

In the embodiment described above, the address is set using a hardware structure of gates and D flip-flops. Instead, the address selection may be performed with software using a controller formed by CPUs and memories. The processing performed by the level comparator 11 and the edge detector 12 in this case will now be described with reference to FIGS. 6A and 6B.

Referring to FIG. 6A, in the level comparator 11, when the start signal is acquired (S111), a variable "sda" is set as "1" (S112). Then, the level comparator 11 compares the address selection signal input to the ADDR terminal with the SDA signal input to the SDA terminal. When the two signals match ("YES" in S113), the variable "sda" is maintained as "1". When the two signals do not match ("NO" in S113), the variable "sda" of the level comparator 11 is set as "0" (S114).

Further, in the level comparator 11, when the start signal is acquired (S115), a variable "vdd" is set as "0" (S116). Then, the level comparator 11 determines whether the address selection signal input to the ADDR terminal is "0". When the address selection signal is "0" ("YES" in S116), the variable "vdd" is maintained as "0". When the address selection signal is "1" ("NO" in S116), the variable "vdd" of the level comparator 11 is set as "1" (S117).

Figure 6B:
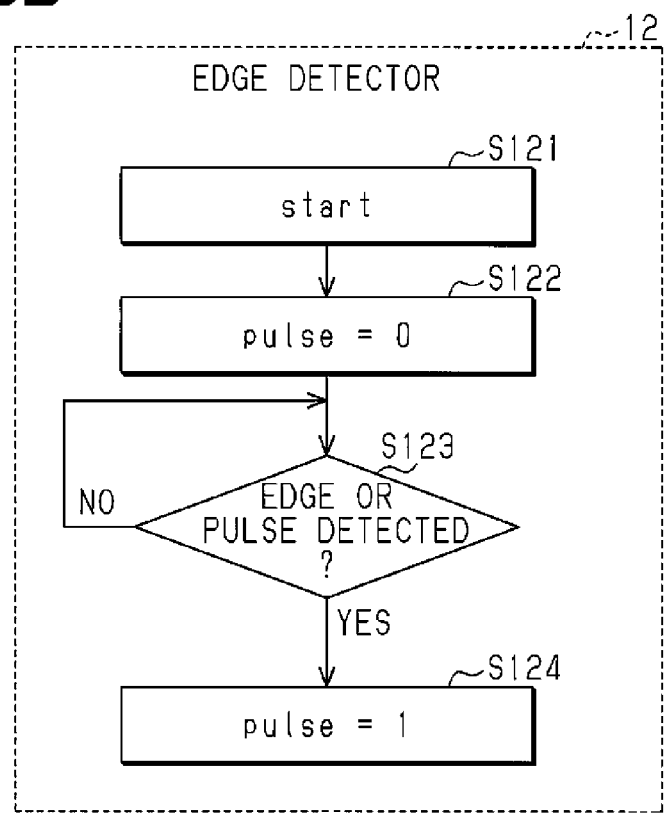

Referring to FIG. 6B, in the edge detector 12, when the start signal is acquired (S121), a variable "pulse" is set as "0" (S122). Then, the edge detector 12 determines whether an edge or a pulse has been detected for the address selection signal input to the ADDR terminal. When an edge or pulse has not been detected ("NO" in S123), the variable "pulse" is maintained as "0". When an edge or pulse has been detected ("YES" in S123), the edge detector 12 sets the variable "pulse" as "1" (S124).

Then, the output decoder 13 uses a table T50, which is shown in FIG. 7, to specify the connected destination of the ADDR terminal in correspondence with the variables "sda", "vdd", and "pulse" and set the address.

In the embodiment described above, the ADDR terminal of the address decoder 10 is assumed as being connected to one of the VDD line, VSS line, SDA line, and SCL line. Instead, when a serial clock signal is not used, edge detection becomes unnecessary, and connection with the SDA line, the power supply line, and the ground line may be specified from the output of the level comparator 11.

The present examples and embodiments are to be considered as illustrative and not restrictive, and the invention is not to be limited to the details given herein, but may be modified within the scope and equivalence of the appended claims.

What is claimed is:

1. An address decoder comprising:
    a reference signal input terminal for a serial data signal;
    an address selection signal input terminal for an address selection signal generated by one of a power supply voltage, a ground voltage, and the serial data signal;
    a signal intensity comparator that compares the serial data signal input to the reference signal input terminal, with the address selection signal input to the address selection signal input terminal, and generates a comparison result; and
    an address setting unit that specifies the signal input as the address selection signal based on the comparison result generated by the signal intensity comparator, and a signal level of the address selection signal to set an address corresponding to the specified signal.

2. The address decoder of claim 1, wherein the signal level of the address selection signal is output when the serial data signal input to the reference signal input terminal does not match the address selection signal input to the selection signal input terminal.

3. The address decoder of claim 1, wherein the address selection signal includes a serial clock signal, the address decoder further comprising:
    an edge detector that detects rising and falling of the address selection signal and outputs an edge detection signal; and
    wherein the address setting unit specifies the signal input as the address selection signal based on the comparison result output by the signal intensity comparator and the edge detection signal output by the edge detector to set an address corresponding to the specified signal.

4. The address decoder of claim 1, wherein the signal intensity comparator unit includes an XOR gate, an OR gate, and a D flip-flop, wherein,
    the XOR gate receives the serial data signal and the address selection signal;
    the OR gate receives an output signal of the XOR gate and an output signal of the D flip-flop; and
    the D flip-flop receives an output signal of the OR gate.

5. A method for setting an address using a reference signal input terminal for receiving a serial data signal, an address selection signal input terminal for receiving an address selection signal generated by one of a power supply voltage, a ground voltage, and a serial data signal, and a controller for outputting the address selection signal, the controller executing the steps of:
    comparing the serial data signal input to the reference signal input terminal with the address selection signal input to the selection signal input terminal, and generating a comparison result; and
    specifying the signal input as the address selection signal based on the comparison result and a signal level of the address selection signal and setting an address corresponding to the specified signal.

* * * * *